United States Patent
Prasad

(10) Patent No.: US 9,838,003 B1
(45) Date of Patent: Dec. 5, 2017

(54) CORRECTING HIGH VOLTAGE SOURCE FOLLOWER LEVEL SHIFT

(71) Applicant: TEXAS INSTRUMENTS INCORPORATED, Dallas, TX (US)

(72) Inventor: Sudheer Prasad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/210,672

(22) Filed: Jul. 14, 2016

(51) Int. Cl.
| | |
|---|---|
| H01H 37/76 | (2006.01) |
| H01H 85/00 | (2006.01) |
| H03K 17/22 | (2006.01) |
| H01L 23/525 | (2006.01) |
| H03K 5/08 | (2006.01) |

(52) U.S. Cl.
CPC ......... *H03K 17/22* (2013.01); *H01L 23/5256* (2013.01); *H03K 5/08* (2013.01)

(58) Field of Classification Search
CPC  H03K 17/22; H03K 5/01; H03K 5/08; H03K 5/082; H03K 5/084; H03K 5/086; H03K 5/088; H03K 5/12
USPC .......... 327/524, 525, 530, 534–543
See application file for complete search history.

(56) References Cited

U.S. PATENT DOCUMENTS

2015/0234451 A1* 8/2015 Inukai .................. G06F 1/3284
713/323

* cited by examiner

*Primary Examiner* — Lincoln Donovan
*Assistant Examiner* — Diana J Cheng
(74) *Attorney, Agent, or Firm* — Lawrence J. Bassuk; Charles A. Brill; Frank D. Cimino

(57) ABSTRACT

A detection circuit includes a first transistor coupled to a gate of a high power transistor, a second transistor whose source is coupled to a drain of the first transistor, a first voltage divider coupled to a source of the first transistor, and a second voltage divider coupled to the source of the second transistor. The first transistor is configured to generate a first transistor output voltage representative of a gate voltage of the high power transistor shifted based on a first gate-to-source voltage of the first transistor. The second transistor is configured to generate a second gate-to-source voltage substantially equal to the first gate-to-source voltage. The first divider is configured to divide the first transistor output voltage by a first factor. The second divider is configured to divide the second gate-to-source voltage by a second factor correlated with the first factor.

20 Claims, 2 Drawing Sheets

CORRECTING HIGH VOLTAGE SOURCE FOLLOWER LEVEL SHIFT

BACKGROUND

Many electrical systems, such as e-fuses, include power supply soft start circuits that consist of a series power transistor whose gate is controlled by an amplifier loop. These circuits provide a soft start during initial power up. In other words, these circuits ramp up the output power over time. These circuits also may provide current limit control. Many of these systems also include a detection capability for determining when the power transistor in the power circuit is ON and the gate of the power transistor is HIGH. This capability provides an indication to a user that the output power is properly being provided by the circuit.

SUMMARY

The problems noted above are solved in large part by systems and methods for detecting that a gate of high power transistor is HIGH. In some embodiments, a detection circuit includes a first transistor coupled to a gate of a high power transistor, a second transistor whose source is coupled to a drain of the first transistor, a first voltage divider coupled to a source of the first transistor, and a second voltage divider coupled to the source of the second transistor. The first transistor is configured to generate a first transistor output voltage representative of a gate voltage of the high power transistor shifted based on a first gate-to-source voltage of the first transistor. The second transistor is configured to generate a second gate-to-source voltage substantially equal to the first gate-to-source voltage. The first voltage divider is configured to divide the first transistor output voltage by a first factor to generate a divided gate voltage. The second voltage divider is configured to divide the second gate-to-source voltage by a second factor to generate a corrected voltage. The second factor is correlated with the first factor.

Another illustrative embodiment is an e-fuse circuit that includes a power supply soft start circuit and a detection circuit. The power supply soft start circuit is configured to generate an output voltage that ramps up over time. The power supply soft start circuit includes an amplifier configured to amplify an input voltage and a high power transistor configured to generate the output voltage. The detection circuit is configured to determine that a gate of the high power transistor is HIGH. The detection circuit comprises a first transistor coupled to the gate of the high speed transistor and a second transistor coupled to the first transistor. The first transistor is configured to generate a first transistor output voltage representative of a gate voltage of the high power transistor shifted based on a first gate-to-source voltage of the first transistor. The second transistor is configured to generate a second gate-to-source voltage substantially equal to the first gate-to-source voltage.

Yet another illustrative embodiment is a method of detecting that a gate of a high power transistor is HIGH. The method includes generating, by a first transistor whose gate is coupled to a gate of the high power transistor, a first transistor output voltage representative of a gate voltage of the high power transistor shifted based on a first gate-to-source voltage of the first transistor. The method also includes generating, by a second transistor whose source is coupled to a drain of the first transistor, a second gate-to-source voltage that is substantially equal to the first gate-to-source voltage. The method also includes dividing, by a first voltage divider, the first transistor output voltage to generate a divided gate voltage. The method also includes dividing, by a second voltage divider, the second gate-to-source voltage to generate a corrected voltage. The method also includes dividing, by a third voltage divider, the corrected voltage and an output voltage from the high power transistor to generate a divided output voltage. The method also includes comparing, by a comparator, the divided gate voltage and the divided output voltage.

BRIEF DESCRIPTION OF THE DRAWINGS

For a detailed description of various examples, reference will now be made to the accompanying drawings in which.

NOTATION AND NOMENCLATURE

Figure 1:
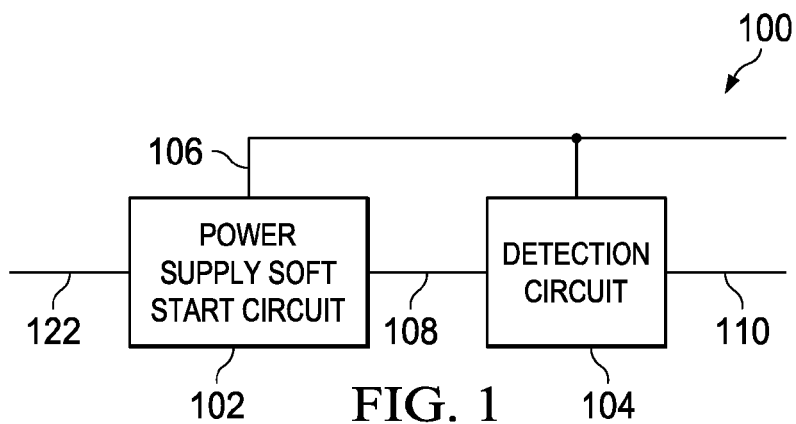
FIG. 1 shows an illustrative block diagram of an e-fuse circuit in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Many systems, such as e-fuses, include power supply soft start circuits that consist of a series power transistor whose gate is controlled by an amplifier loop and a detection circuit for detecting when the power transistor is switched ON and providing power as designed. The detection circuit in conventional systems includes a source follower transistor powered by a charge pump to prevent resistive loading on the gate of the power transistor. A comparator senses between a divided version of the voltage on the power gate and a divided version of the output voltage. However, the source follower transistor acts to level shift the voltage on the gate of the power transistor prior to it being divided. Conventional systems compensate for this level shift by duplicating the source follower on the output voltage. However, this requires an additional charge pump which is inefficient and results in additional current from the main supply. Therefore, it is desirable to compensate for the level shift of the source follower transistor without the need for additional charge pump current.

In accordance with the disclosed principles, a detection circuit includes two source follower transistors, one of the transistors acting to prevent resistive loading on the gate of the power transistor and the second transistor acting as a duplicate of the first source follower transistor to compensate for the level shift created by the first source follower transistor and connected to the output voltage. The second transistor carries the same current as the first source follower so that the charge pump current is reused. Thus, additional current is not required.

FIG. 1 shows an illustrative block diagram of an e-fuse circuit 100 in accordance with various embodiments. E-fuse circuit 100 may include an integrated high power switch (transistor) that is used to manage current, voltage, and/or start-up voltage ramp to a connected load. E-fuse circuit 100 may include a power supply soft start circuit 102 and a detection circuit 104. In some embodiments, some components of the power supply soft start circuit 102 may be included in the detection circuit 104, and similarly, some components of the detection circuit 104 may be included in the power supply soft start circuit 102. In other words, the power supply soft start circuit 102 and the detection circuit 104 may share some components.

The power supply soft start circuit 102 may be configured to generate an output voltage 106 to drive a connected load (not shown). In some embodiments, the power supply soft start circuit 102 receives input voltage 122 which is approximately equal to output voltage 106. However, the power supply soft start circuit 102 acts to ramp up the output voltage 106 to approximately the level of the input voltage 122 over a specified period of time. Thus, the power supply soft start circuit may be known as a dv/dt circuit or a dv/dt loop because the output voltage 106 changes with time until it reaches the approximate level of the input voltage 122. In some embodiments, a user may set the slope of the output voltage 106 ramp. Furthermore, the power supply soft start circuit 102 may provide current limit control on the output load. For example, the current on the high power transistor may be monitored and compared against a user defined threshold value. If the current exceeds the threshold value, the power supply soft start circuit 102 may control the current by controlling the voltage being supplied to the gate of the high power transistor.

The detection circuit 104 is configured to detect whether the gate of the high power transistor in the power supply soft start circuit 102 is HIGH (e.g., approximately 2-2.5 V above the output voltage 106). Once the gate voltage 108 on the high power transistor in the power supply soft start circuit 102 has reached a HIGH level, the detection circuit 104 generates a gate high indication signal 110 that is HIGH. If the gate voltage 108 on the high power transistor in the power supply soft start circuit 102 is below the HIGH level (e.g., below 2-2.5V above the output voltage 106), the detection circuit 104 generates a gate high indication signal 110 that is LOW. In other words, the detection circuit 104 acts to monitor the voltage on the high power transistor in the power supply soft start circuit 102 and generate a gate high indication signal 110 that indicates whether the gate of the high power transistor is HIGH or LOW (e.g., whether the voltage at the gate of the high power transistor has reached a voltage approximately 2-2.5 V above the output voltage 106). In some embodiments, the detection circuit 104 is configured to compare a divided version of the gate voltage (the gate voltage is labelled 108 in FIG. 1) with a divided version of the output voltage 106 to determine whether to generate a HIGH or LOW gate high indication signal 110. The gate high indication signal 110 may be provided to other components of a system which, in some embodiments, may be provided to a user, that indicates whether the power being generated by the power supply soft start circuit 102 (i.e., output voltage 106) is good (i.e., at a voltage level expected). While in FIG. 1, an e-fuse 100 is utilized to illustrate the detection capabilities of detection circuit 104, other circuits, such as low-dropout regulators, current-limit amplifiers, and high voltage amplifiers may also utilize the detection capabilities of detection circuit 104.

Figure 2:
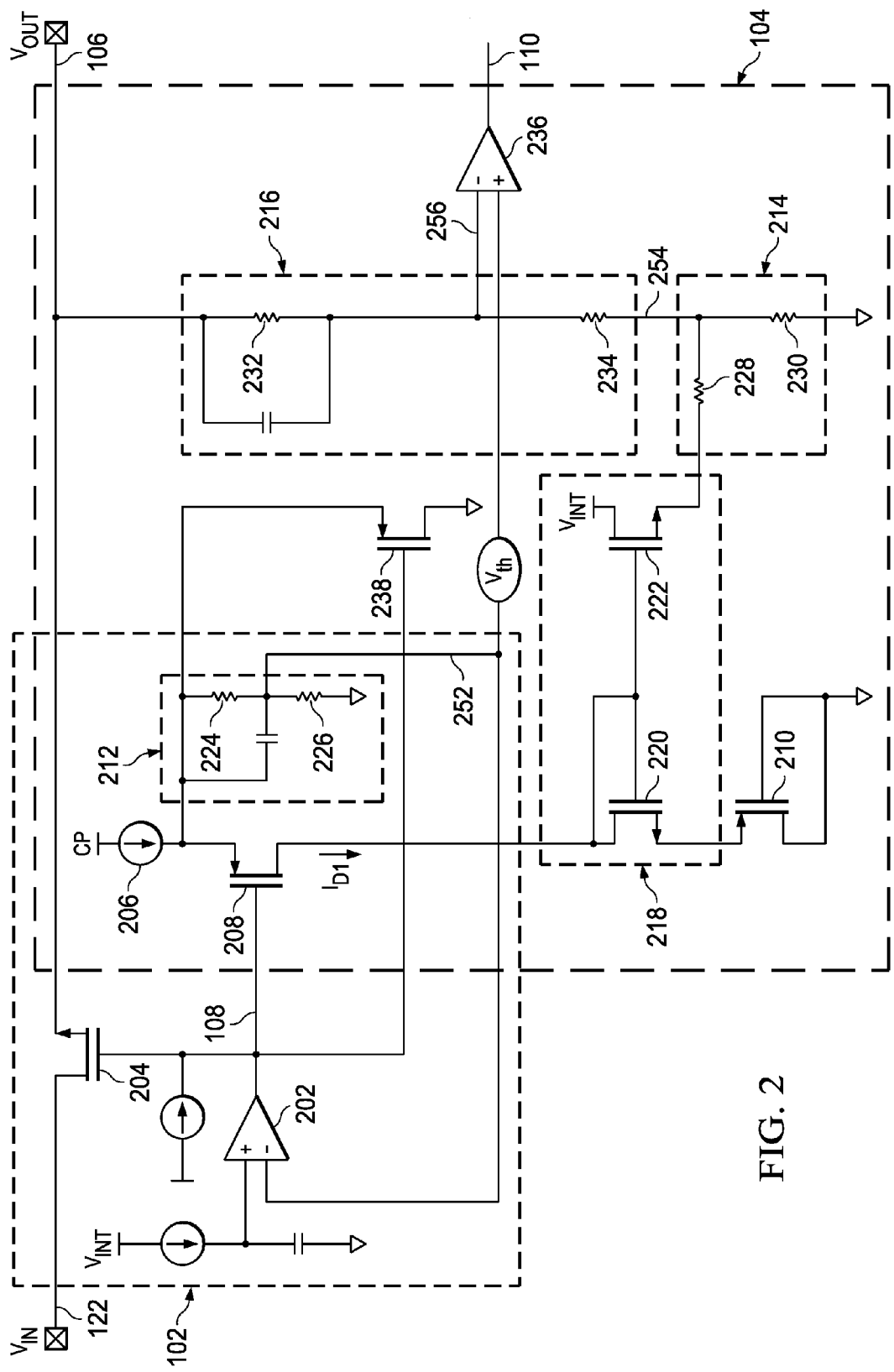
FIG. 2 shows an illustrative circuit diagram of a power supply soft start circuit and detection circuit in accordance with various embodiments.

FIG. 2 shows an illustrative circuit diagram of a power supply soft start circuit 102 and detection circuit 104 in accordance with various embodiments. The power supply soft start circuit 102 may include amplifier 202, high power transistor 204, current supply 206, source follower transistor 208, and voltage divider 212. As discussed above, the power circuit 102 may be configured to generate an output voltage 106 to drive a connected load by ramping up the output voltage 106 at a rate set by a user. Amplifier 202 receives an internal voltage, in some embodiments as its non-inverting input, an internal ramp voltage generated by an internal and an external capacitor set by a user. This internal ramp voltage controls the ramp of output voltage 106. Amplifier 202 also receives, in some embodiments as its inverting input, the divided gate voltage 252. In other words, the amplifier 202 receives the internal voltage that controls the ramp of output voltage 106 and the divided version of the voltage of the gate of high power transistor 204 in a feedback loop. In some embodiments, the amplifier 202 is an operational amplifier configured to output potential that is an amplified version of the received internal voltage with a gain set by the divider 212 to generate the gate voltage 108. In some embodiments, the amplifier 202 is configured to amplify the received internal voltage by approximately 25 times.

The gate voltage 108 may drive the gate of the high power transistor 204. The high power transistor, in some embodiments, is an N-type metal oxide semiconductor (NMOS) transistor that is configured to act as a switch to provide the output power 106 at its source. Thus, the gate voltage 108 acts to control the switching of high power transistor 204. Additionally, the drain of high power transistor 204 receives the input voltage 122. In this configuration, the high power transistor 204 acts to generate the output voltage 106 at approximately the same voltage of the input voltage 122 (i.e., within 2%) when the high power transistor 204 is ON (i.e., whenever the gate of high power transistor 204 is HIGH). Because the high power transistor 204 acts as a switch, the gate voltage 108, and therefore the gate of the high power transistor 204, is driven to approximately 2-2.5V above the output voltage 106 to reduce the ON resistance of the switch.

In order to generate the divided gate voltage 252, the gate of transistor 208, which is a source-follower transistor, is configured to also receive the gate voltage 108. Thus, the gate of transistor 208 is connected to the gate of high power transistor 204. Transistor 208, in some embodiments is a P-type metal oxide semiconductor (PMOS) transistor that is configured to buffer the gate voltage 108 utilizing a received current from charge pump 206. The output voltage of transistor 208 then may be divided by voltage divider 212 to generate the divided gate voltage 252. In some embodiments, the voltage divider 212, which is connected to the source of transistor 208, includes two resistors, resistors 224-226, in a resistor ladder configured such that the output voltage of transistor 208 is divided by a factor k to generate the divided gate voltage 252. The divided gate voltage 252, as discussed above, is then provided to the amplifier 202 in a feedback loop. In this way, the power circuit 108 may generate the output voltage 106. However, due to the configuration of the transistor 208, a gate-to-source voltage dependent level shift may be added to the divided gate voltage 252.

The detection circuit 104 may include the source follower replica transistor 210, the unity buffer 218 comprising transistors 220 and 222, the voltage divider 214, the voltage divider 216, and comparator 236. Additionally, as discussed above, the power supply soft start circuit 102 and the detection circuit 104 may share certain components. Therefore, in some embodiments, the detection circuit 104 may also include the current supply 206, transistor 208, and voltage divider 212 that are also included in the power supply soft start circuit 102. The detection circuit 104 is configured to determine whether the gate of the high power transistor 204 is HIGH.

Transistor 210, in some embodiments, like transistor 208, is a PMOS transistor that is configured to generate a gate-to-source voltage. More particularly, the source of transistor 210 is connected to the drain of transistor 208, in some embodiments via transistor 220. The gate and drain of transistor 210 is connected to ground. As discussed above, the source of transistor 208 receives a current from the charge pump 206, labelled as $I_{d1}$, and generates a gate-to-source voltage based on the received current and the gate voltage 108. Additionally, the current $I_{d1}$ flows from the drain of transistor 208 to the source of transistor 210, which also may be a source-follower transistor. In some embodiments, the transistor 210 has the same gate width and length as transistor 208. Therefore, because the source of both the transistors 208 and 210 receive the same current, $I_{d1}$, the gate-to-source voltage generated by transistor 210 is substantially equal (i.e., within 2%) of the gate-to-source voltage generated by transistor 208. In other words, a replica of the gate-to-source voltage of transistor 208 is generated by transistor 210 by reusing the current generated by the charge pump 206. Thus, due to the configuration of the transistor 210, a voltage-to-source voltage dependent level shift may be added to the source output of transistor 210, and because the transistor has a substantially equal voltage-to-source voltage as transistor 208, the level shift added by transistor 210 is substantially equal to the level shift added by transistor 208.

Unity buffer 218 may be connected to the source of transistor 210. Unity buffer 218 may be configured to receive the gate-to-source voltage generated by transistor 210 and generate an output voltage that is substantially equal (i.e., within 2%) to the inputted gate-to-source voltage generated by transistor 210. In other words, the voltage generated by the unity buffer 218 follows the voltage that is input into the unity buffer 218. In some embodiments, while the voltage generated at the output of the unity buffer 218 is substantially equal to the input voltage, the unity buffer 218 may provide substantial reduction in output impedance, thus maintaining the output voltage despite the loading by resistive divider 214. In some embodiments, the unity buffer 218 includes two transistors, transistors 220-222, which in some embodiments are PMOS transistors. The source of transistor 220 may be connected to the source of transistor 210 and both the drain and the gate of transistor 220 may be connected to the drain of transistor 208. Furthermore the gate of transistor 220 may be connected to the gate of transistor 222. The drain of transistor 222 may receive an internal voltage for power while the source of transistor 222 may be coupled to voltage divider 214.

Voltage divider 214, which is connected to the output of the unity gain buffer 218 and therefore, the source of transistor 210, is configured to divide the gate-to-source voltage of transistor 210, in some embodiments after being buffered by unity buffer 218, to generate corrected voltage 254. In some embodiments, the voltage divider 214 includes two resistors, resistors 228-230, in a resistor ladder configured such that the gate to source voltage of transistor 210 is divided by a factor correlated with the division factor of voltage divider 212. The corrected voltage 254 and the output voltage 106 are received by voltage divider 216, which in some embodiments includes two resistors, resistors 232-234. The voltage divider 216 is configured to generate the divided output voltage 256. The ratio of the resistors 224-226 in voltage divider 212 may be substantially equal (i.e., within 2%) of the ratio of the resistor 232-234E in voltage divider 216 so that the output voltage 106 and corrective voltage 254 are divided by the same division factor as the gate voltage 108. Resistor 234E is the effective resistor formed by the sum of resistors 234 and the parallel combination of resistors 230 and 228.

For example:

$$g_{div} = \frac{V_{gate}}{k} + \frac{V_{gs0}}{k}$$

where $g_{div}$ is the divided gate voltage 252, $V_{gate}$ is the gate voltage 108, $V_{gs0}$ is the gate-to-source voltage of transistor 208, and k is the division factor of voltage divider 212. In this embodiment, $$k = \frac{R_{226}}{R_{226} + R_{224}} = \frac{R_{234E}}{R_{234E} + R_{232}},$$

where $R_{226}$ is the resistance of resistor 226, $R_{224}$ is the resistance of resistor 224, $R_{232}$ is the resistance of resistor 232, and $R_{234E}$ is the resistance of resistor 234 plus the resistance of resistor 230 in parallel with resistor 228. Furthermore:

$$V_{div} = \frac{V_{out}}{k} - V_{corr}\left(1 - \frac{1}{k}\right)$$

where $V_{div}$ is the divided output voltage 256, $V_{out}$ is the output voltage 106, and $V_{corr}$ is the corrective voltage 254. Thus, $$g_{div} - V_{div} = \frac{V_{gate} - V_{out}}{k} - \frac{V_{gs0}}{k} + V_{corr}\left(1 - \frac{1}{k}\right)$$

$$V_{corr} = \frac{V_{gs0}}{k - 1}$$

which implies that the division factor of divider 214 is k−1.

Comparator 236 may comprise a high-gain differential amplifier configured to compare the divided gate voltage 252 with the divided output voltage 256. Comparator 236 receives the divided gate voltage 252 and the divided output voltage 256. Furthermore, the comparator 236 may include an in-built voltage threshold implemented by adding a series internal voltage drop, which in some embodiments is 0.1V (i.e., 100 mV), as shown as $V_{th}$ in FIG. 2. Thus, the comparator 236 may be configured to generate a HIGH gate high indication signal 110 if the divided gate voltage 252 is greater than (i.e., exceeds) the divided output voltage 256 by approximately 2.5V (assuming a division ratio of 25). However, in alternative embodiments, if the division ratio is greater than or less than 25 and/or $V_{th}$ is greater than or less than 0.1V, the comparator 236 may generate a HIGH gate high indication signal 110 if the divided gate voltage 252 is greater than the divided output voltage 256 by any number of volts (depending on the division ratio and the $V_{th}$). In other words, the comparator 236 generates a HIGH gate high indication signal 110 in response to the divided gate voltage 256 being greater than the divided output voltage 256 by an in-built threshold voltage. Conversely, comparator 236 is configured to generate a LOW gate high indication signal 110 if the divided gate voltage 252 is less than approximately 2.5V greater than the divided output voltage 256. In alternative embodiments, if the division ratio is greater than or less than 25 and/or $V_{th}$ is greater than or less than 0.1V, the comparator 236 may generate a LOW gate high indication signal 110 if the divided gate voltage 252 is less than any number of volts greater than the divided output voltage 256 by any number of volts (depending on the division ratio and the $V_{th}$). In other words, the comparator 236 generates a LOW gate high indication signal 110 in response to the divided gate voltage 256 not being greater than the divided output voltage 256 by an in-built threshold voltage. In this way, the detection circuit 104 may generate an accurate gate high indication signal 110 utilizing only one charge pump current thereby saving power and compensating for the level shift created by the transistor 208.

During startup, the gate voltage 108 starts at a low voltage level. Thus, the voltage at the gate of high power transistor 108 is LOW. This may cause the feedback loop in the power supply soft start circuit 102 to break as the source follower goes linear. Therefore, in some embodiments, an additional transistor, transistor 238 may added in parallel to transistor 208 to increase headroom in the detection circuit 104. Transistor 238, which in some embodiments is a PMOS transistor and additional source follower transistor, may also be connected to ground. More specifically, the source of transistor 238 is connected to the source of transistor 208, the gate of transistor 238 is connected to the gate of transistor 208 and high power transistor 204, and the drain of transistor 238 is connected to ground. Thus, during start up, the transistor 238 provides the feedback for the feedback loop in power supply soft start circuit 102. As sufficient gate voltage 108 builds, the transistor 208 will begin to work and share half the current with transistor 238 and the detection circuit 104 will work as discussed above.

Figure 3:
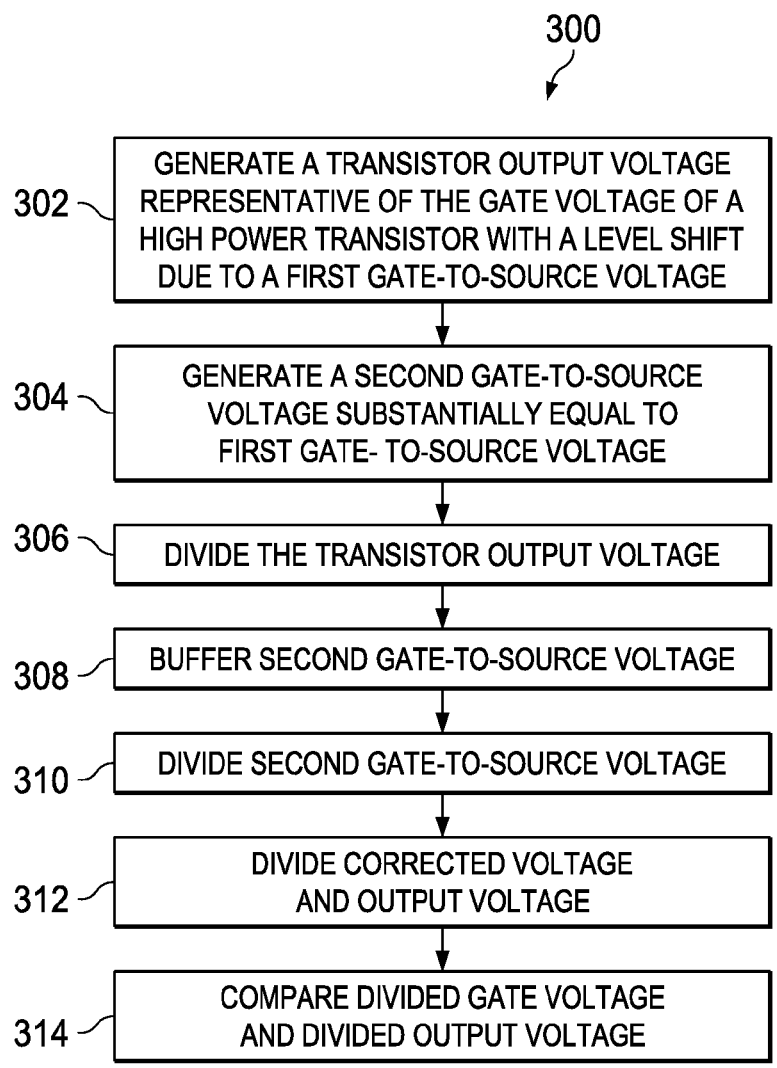
FIG. 3 shows an illustrative flow diagram of a method of detecting that a gate of a high power transistor is HIGH in accordance with various embodiments.

FIG. 3 is an illustrative flow diagram of a method 300 for detecting that a gate of high power transistor 204 is HIGH in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 300, as well as other operations described herein, can be performed by transistors 204, 208-210, 220-222, and 238, voltage dividers 212-216, unity buffer 218, and/or comparator 236 and implemented in logic and/or by a processor executing instructions stored in a non-transitory computer readable storage medium.

The method 300 begins in block 302 with generating a transistor output voltage representative of the gate voltage of a high power transistor, except that the output voltage may include a shift of a first gate-to-source voltage. For example, transistor 208 may receive, at its source, a current from charge pump 206 and, at its gate, gate voltage 108 and generate an output voltage representative of the gate voltage 108. However, due to the gate-to-source voltage of transistor 208 the output voltage may experience a level shift from the gate voltage 108. The method 300 continues in block 304 with generating a second gate-to-source voltage substantially equal to the first gate-to-source voltage. For example, transistor 210 may receive, at its source, a current equivalent to the current received at the source of transistor 208 and generate a gate-to-source voltage substantially equal (i.e., within 2%) of the gate-to-source voltage generated by transistor 208.

In block 306, the method 300 continues with dividing the transistor output voltage. For example, voltage divider 212 may be configured to receive the output voltage from the transistor 208 and divide the voltage by a factor k to generate the divided gate voltage 252. The method 300 continues in block 308 with buffering the gate-to-source voltage. For example, unity buffer 218 may receive the gate-to-source voltage generated by transistor 210 and generate an output voltage that is substantially equal (i.e., within 2%) to the inputted gate-to-source voltage generated by transistor 210. In other words, the voltage generated by the unity buffer 218 follows the voltage that is input into the unity buffer 218. In some embodiments, while the voltage generated at the output of the unity buffer 218 is substantially equal to the input voltage, the unity buffer 218 may provide a substantial reduction in output impedance, thus maintaining the output voltage despite the loading by resistive divider 214.

In block 310, the method 300 continues with dividing the second gate-to-source voltage. For example, the voltage divider 214 receives the gate-to-source voltage of the transistor 210, in some embodiments via the unity buffer 218, and divides the voltage by a factor that corresponds with the factor k to generate a corrected voltage. In an example, the voltage divider 214 may divide the gate-to-source voltage of the transistor 210 by a factor of k−1. The method 300 continues in block 312 by dividing the corrected voltage and output voltage. For example, corrected voltage 254 and the output voltage 106 may be received by voltage divider 216. The voltage divider 216 is configured to generate the divided output voltage 256. The ratio of the resistors 224-226 in voltage divider 212 may be substantially equal (i.e., within 2%) of the ratio of the resistor 232-234E in voltage divider 216 so that the output voltage 106 and corrective voltage 254 are divided by the same division factor as the gate voltage 108. Resistor 234E is the effective resistor formed by the sum of resistors 234 and the parallel combination of resistors 230 and 228.

In block 314, the method 300 continues with comparing the divided gate voltage and the divided output voltage to determine whether the gate high indication signal should be HIGH or LOW. For example, comparator 236 may receive the divided gate voltage 252 and the divided output voltage 256 and may generate a HIGH gate high indication signal 110 if the divided gate voltage 252 is greater than (i.e., exceeds) the divided output voltage 256 by an in-built threshold voltage. Conversely, comparator 236 is may generate a LOW gate high indication signal 110 if the divided gate voltage 252 is not greater than the divided output voltage 256 by an in-built threshold voltage.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A detection circuit, comprising:
 a first transistor coupled to a gate of a high power transistor and configured to generate a first transistor output voltage representative of a gate voltage of the high power transistor shifted based on a first gate-to-source voltage of the first transistor;
 a second transistor, a source of the second transistor coupled to a drain of the first transistor, the second transistor configured to generate a second gate-to-source voltage substantially equal to the first gate-to-source voltage;
 a first voltage divider coupled to a source of the first transistor and configured to divide the first transistor output voltage by a first factor to generate a divided gate voltage; and
 a second voltage divider coupled to the source of the second transistor and configured to divide the second gate-to-source voltage by a second factor, the second factor correlated with the first factor to generate a corrected voltage.

2. The detection circuit of claim 1, further comprising a unity gain buffer coupled to the source of the second transistor and the second voltage divider.

3. The detection circuit of claim 2, wherein the unity gain buffer comprises a third transistor and a fourth transistor, a source of the third transistor coupled to the source of the second transistor, a gate of the third transistor coupled to a gate of the fourth transistor, and a source of the fourth transistor coupled to the second voltage divider.

4. The detection circuit of claim 1, wherein a drain of the second transistor is connected to ground.

5. The detection circuit of claim 1, further comprising a third voltage divider, the third voltage divider configured to receive an output voltage of the high power transistor and the corrected voltage to generate a divided output voltage.

6. The detection circuits of claim 5, further comprising a comparator configured to compare the divided output voltage and the divided gate voltage and, in response to the divided gate voltage being greater than the divided output voltage by an in-built threshold voltage, generate a gate high indication signal that is HIGH.

7. The detection circuit of claim 5, wherein:
 the first voltage divider comprises a first resistor and second resistor;
 the third voltage divider comprises a third resistor and fourth effective resistor; and
 a ratio of the first resistor to the second resistor is substantially equal to a ratio of the third resistor to the fourth effective resistor.

8. The detection circuit of claim 7, wherein the fourth effective resistor includes a fifth resistor in parallel with a combination of a sixth resistor and a seventh resistor included in the second voltage divider.

9. The detection circuit of claim 1, wherein a source of the first transistor is configured to receive a current at a first level and the source of the second transistor is configured to receive the current at the first level.

10. The detection circuit of claim 1, wherein the first and second transistors are P-type metal oxide semiconductor (PMOS) transistors and the high power transistor is an N-type metal oxide semiconductor (NMOS) transistor.

11. An e-fuse circuit, comprising:
 a power supply soft start circuit configured to generate an output voltage that ramps up over time, the power supply soft start circuit including:
  an amplifier configured to amplify an input voltage; and
  a high power transistor configured to generate the output voltage; and
 a detection circuit configured to determine that a gate of the high power transistor is HIGH, the detection circuit including:
  a first transistor coupled to the gate of the high power transistor and configured to generate a first transistor output voltage representative of a gate voltage of the high power transistor shifted based on a first gate-to-source voltage of the first transistor; and
  a second transistor coupled to the first transistor and configured to generate a second gate-to-source voltage substantially equal to the first gate-to source voltage.

12. The e-fuse circuit of claim 11, wherein the detection circuit further includes:
 a first voltage divider coupled to a source of the first transistor and configured to divide the first transistor output voltage by a first factor to generate a divided gate voltage;
 a second voltage divider coupled to a source of the second transistor and configured to divide the second gate-to-source voltage by a second factor that is correlated with the first factor to generate a corrected voltage; and
 a third voltage divider coupled to a source of the high power transistor and the second voltage divider and configured to receive the output voltage and the corrected voltage and generate a divided output voltage.

13. The e-fuse circuit of claim 12, wherein the detection circuit further includes a comparator configured to receive and compare the divided output voltage and the divided gate voltage and, in response to the divided gate voltage being greater than the divided output voltage by an in-built threshold voltage, generate a gate high indication signal that is HIGH.

14. The e-fuse circuit of claim 12, wherein the detection circuit further includes a unity gain buffer coupled to the second voltage divider and the source of the second transistor in series.

15. The e-fuse circuit of claim 11, wherein the detection circuit further includes a fourth transistor coupled to the first transistor in parallel, a source of the fourth transistor coupled to a source of the first transistor, a gate of the fourth transistor coupled to a gate of the first transistor, and a drain of the fourth transistor coupled to ground.

16. A method of detecting that a gate of a high power transistor is HIGH, comprising:
 generating, by a first transistor whose gate is coupled to a gate of the high power transistor, a first transistor output voltage representative of a gate voltage of the high power transistor shifted based on a first gate-to-source voltage of the first transistor;
 generating, by a second transistor whose source is coupled to a drain of the first transistor, a second gate-to-source voltage that is substantially equal to the first gate-to-source voltage;
 dividing, by a first voltage divider, the first transistor output voltage to generate a divided gate voltage;

dividing, by a second voltage divider, the second gate-to-source voltage to generate a corrected voltage;

dividing, by a third voltage divider, the corrected voltage and an output voltage from the high power transistor to generate a divided output voltage; and comparing, by a comparator, the divided gate voltage and the divided output voltage.

17. The method of claim 16, wherein the first voltage divider includes a first resistor and a second resistor, the third voltage divider includes a third resistor and a fourth effective resistor, and the fourth effective resistor includes a sum of a fifth resistor and a parallel combination of a sixth resistor and a seventh resistor included in the second voltage divider, and a ratio of the first resistor to the second resistor is substantially equal to a ratio of the third resistor to the fourth effective resistor.

18. The method of claim 16, further comprising, prior to dividing the second-gate-to-source voltage, buffering, by a unity buffer, the second gate-to-source voltage.

19. The method of claim 16, wherein a drain of the second transistor is coupled to ground.

20. The method of claim 16, wherein the first and second transistors are P-type metal oxide semiconductor (PMOS) transistors and the high power transistor is a N-type metal oxide semiconductor (NMOS) transistor.

* * * * *